US006791402B2

United States Patent
Leenaerts et al.

(10) Patent No.: US 6,791,402 B2
(45) Date of Patent: Sep. 14, 2004

(54) TUNABLE INTEGRATED RF FILTER HAVING SWITCHED FIELD EFFECT CAPACITORS

(75) Inventors: Dominicus Martinus Wilhelmus Leenaerts, Eindhoven (NL); Eise Carel Dijkmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/055,361

(22) Filed: Jan. 23, 2002

(65) Prior Publication Data

US 2002/0097084 A1 Jul. 25, 2002

(30) Foreign Application Priority Data

Jan. 24, 2001 (EP) .............................. 01200239

(51) Int. Cl.[7] .............................. H03B 1/00; H03K 5/00; H04B 1/10
(52) U.S. Cl. ........................... 327/557; 327/553
(58) Field of Search ................................. 327/551–559; 333/167, 173, 205, 207; 330/9

(56) References Cited

U.S. PATENT DOCUMENTS

| 4,092,619 | A | | 5/1978 | Huggins ................. 333/70 R |
| 4,559,498 | A | * | 12/1985 | Sokoloff .................... 327/337 |
| 5,220,194 | A | | 6/1993 | Golio et al. ................ 257/601 |
| 5,949,295 | A | * | 9/1999 | Schmidt ................. 331/117 R |
| 6,133,775 | A | * | 10/2000 | Schambacher et al. ..... 327/337 |
| 6,285,865 | B1 | * | 9/2001 | Vorenkamp et al. ........ 455/307 |
| 6,400,217 | B1 | * | 6/2002 | Bhandari ................... 327/554 |

* cited by examiner

Primary Examiner—Quan Tra
(74) Attorney, Agent, or Firm—Aaron Waxler

(57) ABSTRACT

A filter (3) is described, which filter is provided with field effect (FET) capacitors (M1–32; M'1–32) arranged for controlling their respective capacity values, each such FET capacitor (M1–32; M'1–32) having a source (S) and a drain (D). The source (S) and the drain (D) of each FET capacitor (M1–32; M'1–32) are coupled to one another. The filter acting as an impedance transformer is a passive low power consuming and tunable filter, such as for a radio frequency (RF) receiver. It occupies only a very small area, while integrated on chip.

Figure 1:
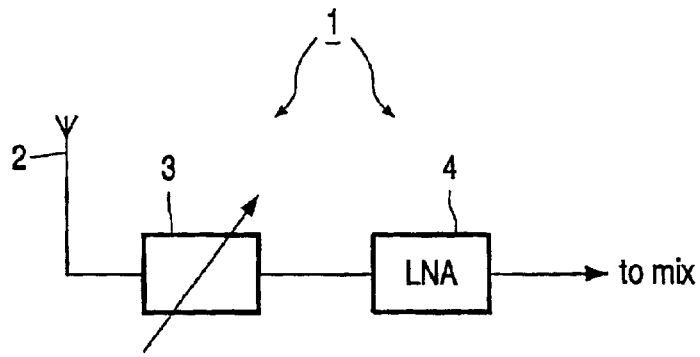

11 Claims, 1 Drawing Sheet ously not consume a lot of power. Although the coupled source drain
TUNABLE INTEGRATED RF FILTER HAVING SWITCHED FIELD EFFECT CAPACITORS The present invention relates to a filter provided with field effect (FET) capacitors arranged for controlling their respective capacity values, each such FET capacitor having a source and a drain.

The present invention also relates to a receiver and/or transmitter provided with such a filter.

Such a filter is known from U.S. Pat. No. 4,092,619. The filter disclosed therein concerns a metal oxide semiconductor field effect (MOSFET) voltage controlled low-pass filter. The MOSFET filter comprises a plurality of easy to integrate semiconductor filtering devices coupled in series through an active buffer, which may be a source follower. The semiconductor filtering devices each have a control input or gate and form capacitors, whose capacitor values are controlled by a voltage source connected to the gates. The controllable capacitor values enable the filter cut-off frequency to be controllable too. This way a tunable, but not solely passive low-pass filter for only the audio range is realised.

Therefore it is an object of the present invention to provide a tunable, but passive filter, capable of also operating in a higher frequency range, such as the radio frequency (RF) range and capable of being integrated on chip, on only a limited IC area.

Thereto the filter according to the invention is characterised in that the source and the drain of each FET capacitor are coupled to one another.

It is an advantage of the filter according to the present invention that it is also capable of operating in the RF range and that it can in particular be used as a tunable band-pass filter in a receiver, transmitter or combined transceiver. The filter is entirely passive and therefore does virtually not consume a lot of power. Although the coupled source drain could be used as a control input for controlling the capacitor values of the respective FET capacitors, it is preferred to control the FET capacitors on their respective gates. This is because if the gate would be present in the signal path, this would result in a necessary so called Electro Static Discharge (ESD) resistor in said signal path, which would decrease a wanted high Q-factor of the filter.

An embodiment of the filter according to the invention is characterised in that each FET capacitor has a control input for voltage dependent capacity value control.

This control input will thus preferably be the gate of the FET capacitor, also because advantageously the gate current is practically virtually neglectable. A high Q-factor of the filter results, because the above mentioned ESD resistor is omitted in the signal path.

A further embodiment of the filter according to the invention is characterised in that the filter is provided with control means coupled to FET capacitor control inputs.

These control means may even advantageously be simple switching means and/or decoding means capable of switching one or more FET capacitors or FET capacitor banks into the signal path of the filter and/or capable of correspondingly controlling the capacitor values concerned respectively.

A still further embodiment of the filter according to the invention is characterised in that the FET capacitors are split in equally controlled pairs of FET capacitors.

This is particularly advantageous if the filter is built up as a symmetrically filter having a symmetrical input and a symmetrical output, because it provides a large degree of design freedom.

At wish two or more of the FET capacitors are connected in series, in order to allow larger capacitor values to be created, which in addition are variable over a large capacitor value range.

Preferably the FET capacitors are metal oxide semiconductor (MOSFET) capacitors, capable of providing small but accurately controllable capacitor values, in order to enable the filter according to the invention to be an RF filter, which is particularly suitable for operating in the radio frequency range.

The present invention also relates to a transmitter, receiver, or transceiver having an above mentioned filter, which filter is provided with field effect (FET) capacitors arranged for controlling their respective capacity values, each such FET capacitor having a source and a drain, and characterised in that the source and the drain of each FET capacitor are coupled to one another.

The above advantages also apply to the transmitters, receivers and/or transmitter/receivers concerned.

Figure 2:
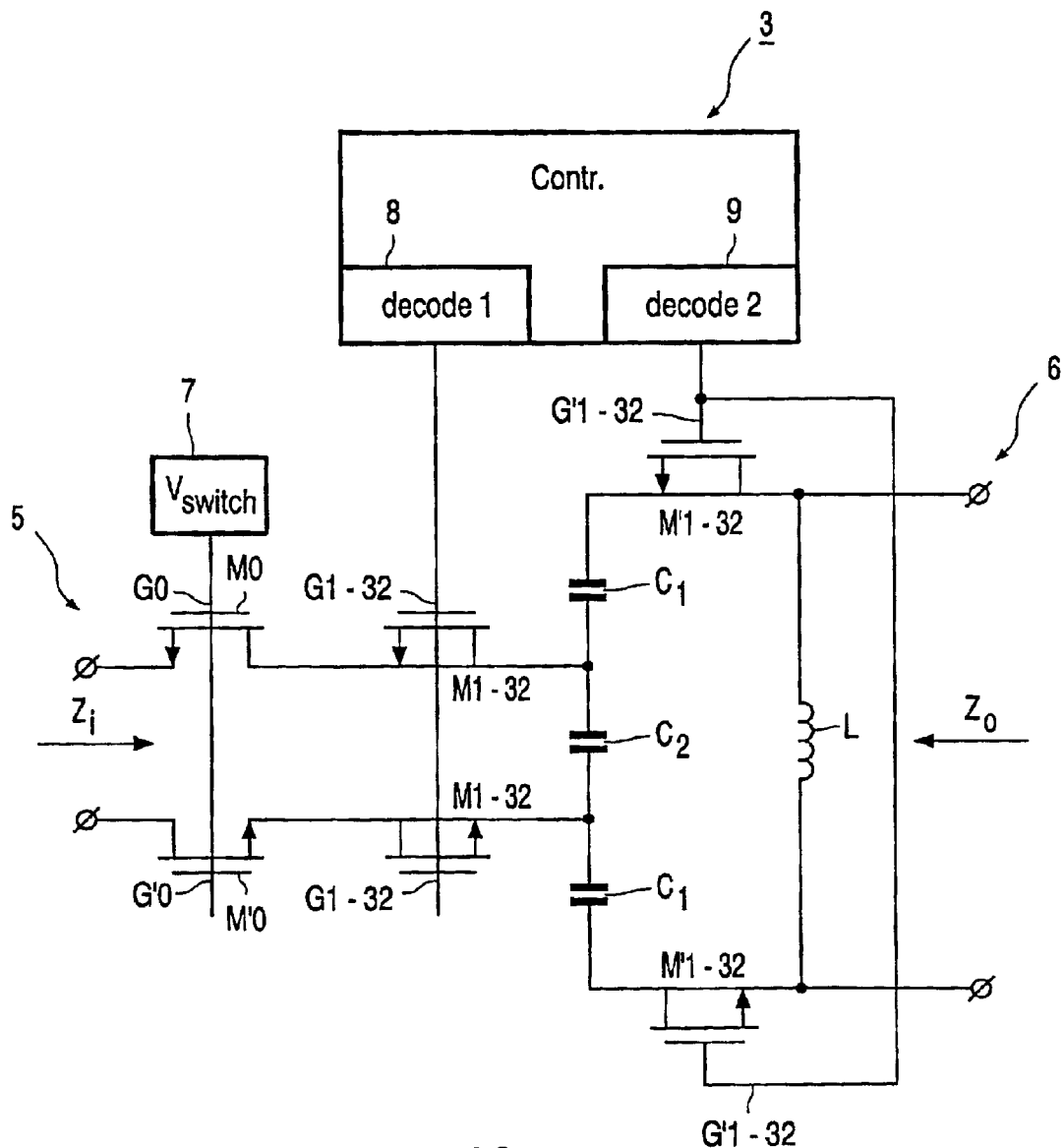

At present the filter according to the invention will be elucidated further together with its additional advantages while reference is being made to the appended drawing, wherein similar components are being referred to by means of the same reference numerals. In the drawing:

FIG. 1 shows a front end for a schematically depicted receiver, which is provided with a filter according to the invention; and FIG. 2 shows an embodiment of the filter according to the invention, which is implemented in an radio frequency (RF) filter.

FIG. 1 shows in particular an RF front-end 1 of a receiver or receiver part of for example a transmitter/receiver. The receiver part is generally coupled to mixing means (not shown). The RF front-end 1 as shown comprises an antenna 2, a filter 3 in the form of an RF filter, and a low noise amplifier section 4, respectively coupled to one another. The RF filter 3 is mostly equipped as a band-pass filter, in order to filter out the relevant frequency range, which is then processed further by the low noise amplifier and mixer sections. Recent attempts have been made to fully integrate a receiver on a IC chip area having only a minor area. This poses very strong demands on the complexity of the circuitry to be integrated, in particular concerning circuit characteristics, heat developed on chip, power consumption and the like. Nevertheless a sufficient amount of design flexibility has to be maintained. This also concerns the filters, such as the RF filter 3, which also has to provide accurate and reproducible filter characteristics. In addition the filter 3 has to be tunable and has to provide for input impedance and output impedance matching and adjustment.

FIG. 2 shows an embodiment of such a filter 3, which is implemented as a tunable RF filter. The filter 3 is an RF band-pass filter having a high quality (Q) factor. The filter 3 also transforms an RF input impedance $z_i$ at filter input 5 to an RF output impedance $Z_O$ at filter output 6. Basically the filter 3 as shown comprises capacitors $C_1$, $C_2$ and coil L. Additional FET, such as MOSFET capacitors may be added to the filter 3. In this case filter input 5 is coupled to two FETs M0 and M'0, whose respective gates G0 and G'0 are coupled to switching means 7 providing a switching signal $V_{switch}$ for switching the filter 3 ON and OFF. In this case N-FETs and P-FETs M0 and M'0 act as filter switches. Apart from possible high frequency blocking coils (not shown) the filter input 5 is coupled to a series arrangement of pairs of—in this case each 32—FET capacitors M1 ... M32, in addition to further FET capacitor pairs M'1 ... M'32, which are also added to the filter 3 after the capacitors $C_1$. The filter 3 comprises control means (Contr.), here in the form of separate decoders 8 and 9, coupled to each of the gates G1 ... G32 and G'1 ... G'32 respectively. Drains (D) and sources (S) of each of the pairs MOSFET capacitors M1 ... M32 and M'1 ... M'32 are short circuited, as shown. By properly implementing the split up decoders 8 and 9 to provide respective control signals—in this case voltages—at said respective control gates G1 ... G32 and G'1 ... G'32 in order to control their respective voltage dependent capacitor values, a proper high Q tuning as well as adjustment of a wanted input-output impedance matching can be achieved, while the power consumption due to the filter 3 being passive is minimized.

Off course the filter 3 may be designed as a symmetrical or not-symmetrical low-pass filter, a high-pass filter, or a band-stop or band-pass filter or any wanted combination thereof. All types of suitable capacitor controllable FET semiconductors may be used as FET capacitors. Whilst the above has been described with reference to essentially preferred embodiments and best possible modes it will be understood that these embodiments are by no means to be construed as limiting examples of the filter concerned, because various modifications, features and combination of features falling within the scope of the appended claims are now within reach of the skilled person.

What is claimed is:

1. A tunable radio frequency (RF) band-pass filter provided with field effect (FET) capacitors arranged for controlling their respective capacity values, each such FET capacitor having a source (S) and a drain (D), characterised in that the source (S) and the drain (D), of each FET capacitor are coupled to one another at a common connection point, and said common connection points are coupled to each other through a capacitor, the tunable RF band-pass filter including an arrangement for tuning the tunable RF band-pass filter by selectively controlling the voltage dependent capacitor values or the FET capacitors, the tunable RF band-pass filter transforming an RF input impedance at a filter input to an RF output impedance at a filter output.

2. The filter according to claim 1, characterised in that each FET capacitor has a control input for voltage dependent capacity value control.

3. The filter according to claim 2, characterised in that the tuning arrangement is provided with control means coupled to the FET capacitor control inputs.

4. The filter according to claim 1, characterised in that the FET capacitors are split in equally controlled pairs or FET capacitors.

5. The filter according to claim 1, characterised in that the filter is built up as a symmetrical filter having a symmetrical input and a symmetrical output.

6. The filter according to claim 1, characterised in that two or more of the FET capacitor, are connected in series.

7. The filter according to claim 1, characterised in that the FET capacitors are metal oxide semiconductor (MOSFET) capacitors.

8. The filter according to claim 1, wherein an input to the filter is coupled to a series arrangement of pairs of the FET capacitors.

9. The filter according to claim 8, wherein the series arrangement of pairs of the FET capacitors are split in equally controlled pairs of the FET capacitors.

10. The filter according to claim 1, wherein the tuning arrangement includes a decoder coupled to a gate of each of the FET capacitors.

11. A tunable radio frequency (RF) band-pass filter according to claim 1, wherein each FET capacitor further comprises a gate (G), and each FET capacitor is controlled by a signal on said gate.

* * * * *